United States Patent
Dobler et al.

(10) Patent No.: US 7,060,534 B2
(45) Date of Patent: Jun. 13, 2006

(54) HOUSING FOR SEMICONDUCTOR DEVICES, SEMICONDUCTOR DEVICE PIN, AND METHOD FOR THE MANUFACTURING OF PINS

(75) Inventors: Manfred Dobler, Regensburg (DE); Georg Erhard Eggers, München (DE); Christian Stocken, München (DE)

(73) Assignee: Infineon Technologies AG, Munich (DE)

( * ) Notice: Subject to any disclaimer, the term of this patent is extended or adjusted under 35 U.S.C. 154(b) by 5 days.

(21) Appl. No.: 10/757,549

(22) Filed: Jan. 15, 2004

(65) Prior Publication Data

US 2004/0197978 A1    Oct. 7, 2004

(30) Foreign Application Priority Data

Jan. 16, 2003    (DE) .............................. 103 01 480

(51) Int. Cl.
*H01L 21/44*    (2006.01)

(52) U.S. Cl. .................. 438/121; 438/123; 438/106

(58) Field of Classification Search ................. None
See application file for complete search history.

(56) References Cited

U.S. PATENT DOCUMENTS

| 5,736,428 A | 4/1998 | Kasai et al. |
| 5,877,548 A | 3/1999 | Washida et al. |
| 5,940,279 A * | 8/1999 | Gademann et al. ......... 361/823 |

FOREIGN PATENT DOCUMENTS

| JP | 63-272061 A | 11/1988 |
| JP | 2-28356 | 1/1990 |
| JP | 02158162 | 6/1990 |
| JP | 8-46112 | 2/1996 |
| JP | 2000150771 | 5/2000 |

* cited by examiner

*Primary Examiner*—Thao P. Le

(74) *Attorney, Agent, or Firm*—Morrison & Foerster LLP

(57) ABSTRACT

A housing, in particular for semiconductor devices, a semiconductor device pin, and a method for the manufacturing of pins wherein at least one pin is punched out from a basic body, in particular a lead framed, by means of one or a plurality of punching process steps, wherein the pin is coated with a separate metal layer after the final punching out of said pin.

12 Claims, 6 Drawing Sheets

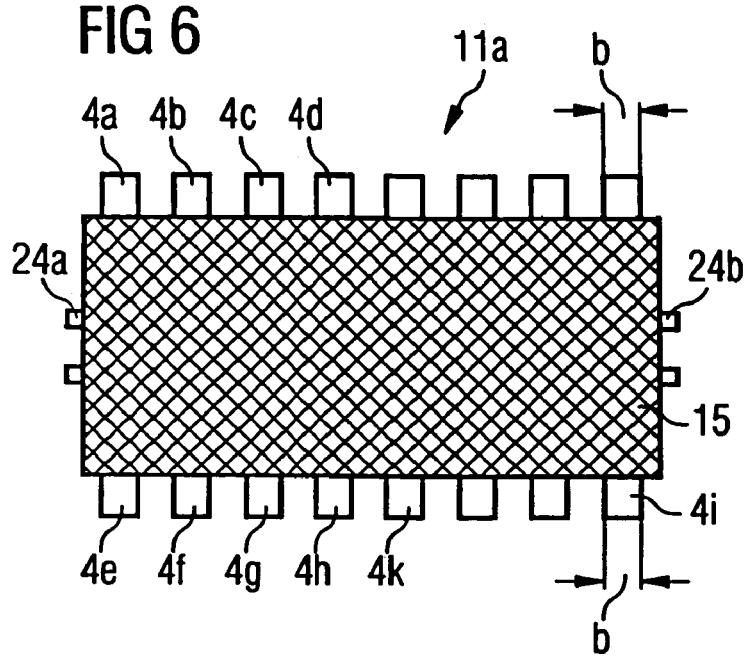
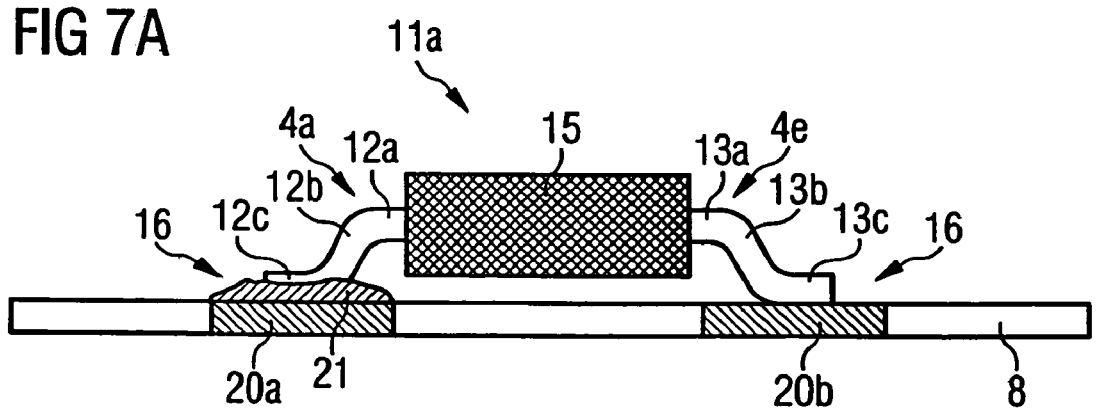
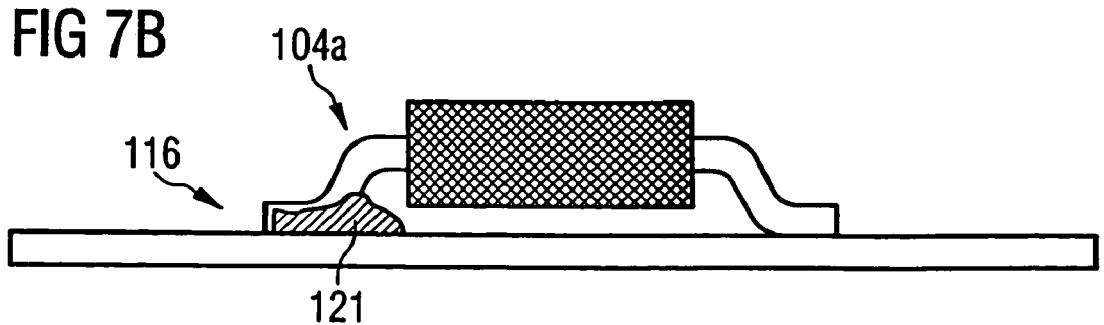

HOUSING FOR SEMICONDUCTOR DEVICES, SEMICONDUCTOR DEVICE PIN, AND METHOD FOR THE MANUFACTURING OF PINS

CLAIM FOR PRIORITY

This application claims the benefit of priority to German Application No. 103 01 480.2, filed in the German language on Jan. 16, 2003, the contents of which are hereby incorporated by reference.

TECHNICAL FIELD OF THE INVENTION

The invention relates to a housing, in particular for semiconductor devices, a semiconductor device pin, and a method for the manufacturing of pins.

BACKGROUND OF THE INVENTION

For the manufacturing of semiconductor devices (e.g. corresponding, integrated (analog or digital) computing circuits, semiconductor memory devices such as functional memory devices (PLAs, PALs, etc.) and table memory devices (e.g. ROMs or RAMs, in particular SRAMs and DRAMs)), so-called wafers (i.e. thin discs of monocrystalline silicon) are used.

The wafers are processed appropriately (e.g. subject to a plurality of coating, exposure, etching, diffusion and implantation process steps, etc.), and subsequently e.g. sawn apart (or e.g. scratched and broken), so that the individual devices are then available.

After the sawing apart of the wafer, the devices—which are then available individually—are loaded each individually into special housings or packages, respectively (e.g. corresponding housings adapted to be mounted by plugging or on the surface, e.g. so-called TSOP housings, etc.), and subsequently corresponding semiconductor device contacts (pads) (that are provided, for instance, at the top of the semiconductor devices) are—e.g. by means of appropriate bonding wires—connected with appropriate connection pins of the respective housing.

The connection pins serve to connect one or a plurality of semiconductor devices to a corresponding semiconductor device module (e.g. a corresponding circuit board).

The connection pins may—in particular in the case of TSOP housings—for instance extend from corresponding housing side walls (for instance from a left and a right housing side wall) laterally downwards (wherein a plurality, e.g. more than five or seven, connection pins may be arranged side by side at one and the same side wall).

When corresponding (bottom) end sections of the connection pins are soldered to corresponding pads at the circuit board, an electrical contact is produced between the corresponding module or circuit board pad, respectively, and the corresponding connection pin (and thus also an electrical contact to the corresponding semiconductor device contact (pad) connected therewith).

However, the circuit board and the semiconductor device housing connected thereto in the above-described manner in general each have different thermal coefficient of expansion.

During the heating or cooling down of a semiconductor device module, mechanical tensions will thus occur between the circuit board and the semiconductor device housing.

These mechanical tensions may be so great that a breaking up or tearing apart of the soldering connection between a connection pin and the corresponding module or circuit board pad may result.

As a rule, in the case of connection pins positioned side by side (e.g. at one and the same side wall), the soldering connections of those connection pins will tear apart first that are positioned outermost at the housing (e.g. positioned most right or most left at the front or rear side wall)—the tensions produced by the above-mentioned different coefficients of expansion of the circuit board and the semiconductor device housing are greatest with these pins.

The breaking up or tearing apart of soldering connections is one of the most frequent reasons for the failure of semiconductor device modules.

SUMMARY OF THE INVENTION

The invention provides a novel housing, in particular for semiconductor devices, a novel semiconductor device pin, and a novel method for the manufacturing of pins.

In accordance with one embodiment of the invention, there is a method for the manufacturing of pins, wherein, by means of one or a plurality of punching process steps, at least one pin is punched out from a basic body, in particular a lead frame, wherein the pin is coated with a separate metal layer after the final punching out of the pin.

Thus, it may, for instance, be achieved that the front face at the outer end section of the pin is also coated with a metal layer.

When such a pin is—by means of an appropriate soldering process—connected to a circuit board, the respective pin front face will, by the soldering connection provided thereby, also be wetted by the solder—the soldering connection may thus be subject to relatively strong mechanical strain.

Other than with the above-mentioned proceeding for the manufacturing of pins, in the prior art the basic body or lead frame is coated with a corresponding metal layer prior to the final punching out of a pin, and only subsequently is the pin (finally) punched out from the basic body or lead frame—then, the pin front face will not possess any metal layer.

When such a pin is soldered to a circuit board, it is not properly safeguarded. That is, when the soldering connection is provided, the respective pin front face is also wetted by the solder. Thus, the soldering connection may, in general, be subject to only a relatively weak mechanical strain.

Since—as explained above—more stable soldering connections can be provided with the invention, compared to the prior art, breaking or tearing up of, for example, the soldering connections—e.g. due to the above-mentioned mechanical tensions caused by different thermal coefficients of expansion of the semiconductor device housing and the circuit board—may be avoided.

BRIEF DESCRIPTION OF THE DRAWINGS

In the following, the invention will be explained in detail with reference to the various embodiments as detailed in the drawings. The drawings show:

FIG. 6 shows a top view of the housing illustrated in FIGS. 1, 2, 3, and 4 after carrying out the punching process steps.

FIG. 7a shows a front view of the housing illustrated in FIGS. 1, 2, 3, 4, and 6 after carrying out the punching and galvanizing process steps, and after the connection to a circuit board.

FIG. 7b shows a front view of a conventionally manufactured housing after the connection to a circuit board.

DETAILED DESCRIPTION OF THE INVENTION

Figure 1:
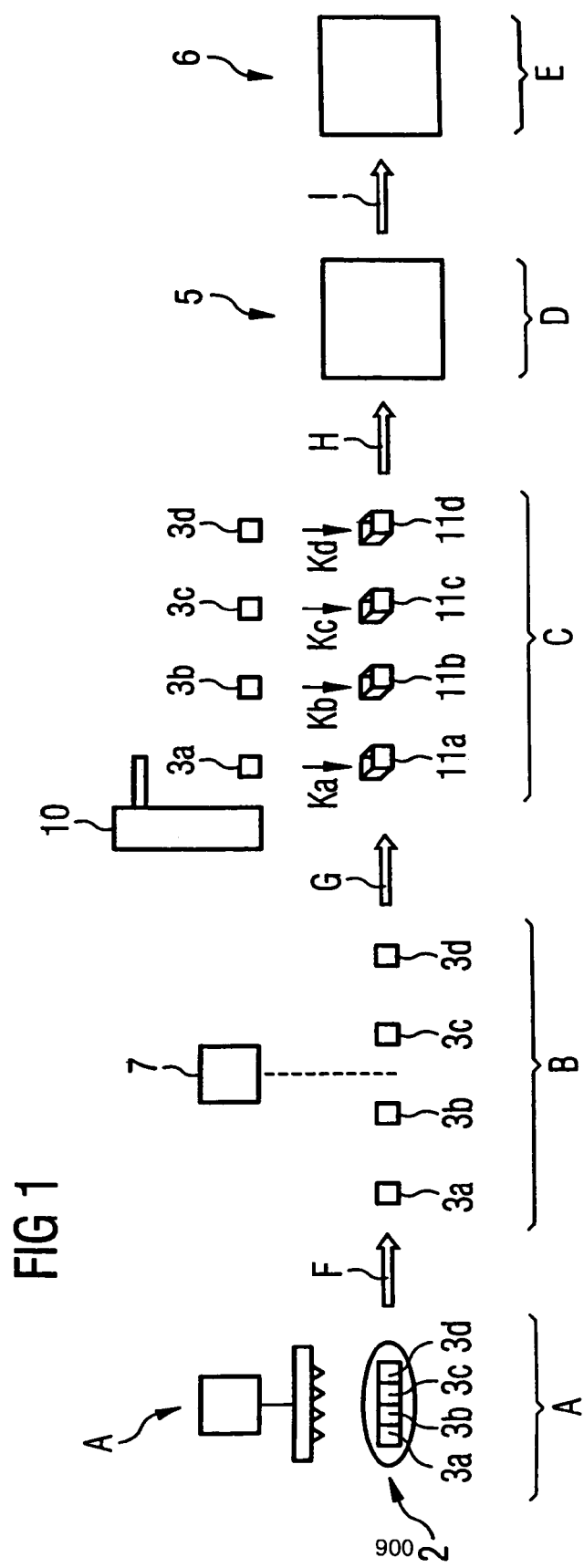
FIG. 1 shows stations passed through by corresponding semiconductor devices during the manufacturing of semiconductor devices.

FIG. 1 shows some (out of a plurality of further, not illustrated) stations A, B, C, D passed through by corresponding semiconductor devices 3a, 3b, 3c, 3d during the manufacturing of semiconductor devices 3a, 3b, 3c, 3d.

At station A, semiconductor devices 3a, 3b, 3c, 3d that are still available on a silicon disc or a wafer 2, respectively, are subject to one or a plurality of testing methods by means of a testing system 1.

Before that, the wafer 2 had been subject, at stations not shown here and preceding the stations A, B, C, D illustrated in FIG. 1, to appropriate, conventional coating, exposure, etching, diffusion and implantation process steps.

The semiconductor devices 3a, 3b, 3c, 3d may, for instance, be appropriate, integrated (analog or digital) computing circuits, or semiconductor memory devices such as functional memory devices (PLAs, PALs, etc.) or table memory devices (e.g. ROMs or RAMs), for instance SRAMs or DRAMs (Dynamic Random Access Memories or dynamic read-write memories, respectively) in particular SDRAMs or DDR-DRAMs.

When the testing method(s) has (have) been finished successfully, the wafer 2 is transported further (in a fully automated manner) to the following station B (cf. Arrow F) and is there, by means of an appropriate machine 7, sawn apart (or e.g. scratched and broken), so that the individual semiconductor devices 3a, 3b, 3c, 3d are then available.

After sawing apart the wafer 2 at station B, the devices 3a, 3b, 3c, 3d are (again in a fully automated manner, e.g. by means of an appropriate conveying machine) transported further to the following station C (here: a loading station C) (e.g. directly (or individually, respectively), or alternatively e.g. by means of an appropriate tray) (cf. Arrow G).

At the loading station C, the devices 3a, 3b, 3c, 3d are—individually each—loaded in a fully automated manner by means of an appropriate machine 10 (loading machine) into corresponding housings 11a, 11b, 11c, 11d or packages, respectively (cf. Arrows $K_a$, $K_b$, $K_c$, $K_d$).

Figure 5:
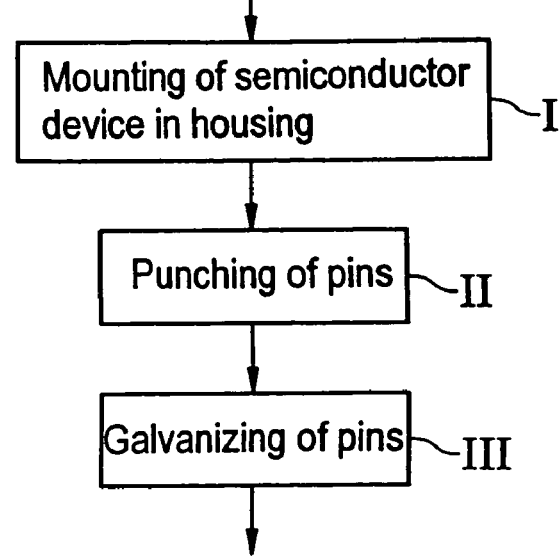
FIG. 5 shows a flowchart for illustration of the process steps carried out with the embodiment of the invention.

Subsequently—again in a fully automated manner—corresponding semiconductor device contacts (pads) (provided, for instance, at the top of the semiconductor devices 3a, 3b, 3c, 3d) are—e.g. by means of corresponding bonding wires—connected with corresponding connection pins 4a, 4b, 4c, 4d, 4e, 4f, 4g, 4h, 4i of the respective housing 11a, 11b, 11c, 11d (or more exactly: with corresponding parts of a pin basic body 14 or lead frame 14, respectively, cf. below)—so-called bonding—and the corresponding housing 11a, 11b, 11c, 11d is then—in a manner known per se—closed (cf. also step I, FIG. 5).

As housings 11a, 11b, 11c, 11d, conventional housings adapted to be mounted by plugging, in particular on the surface (SMD housings (SMD=Surface Mount Device)) may, for instance, be used, e.g. so-called TSOP housings, etc.

Next, as will be explained more exactly in the following, the housings 11a, 11b, 11c, 11d are—together with the semiconductor devices 3a, 3b, 3c, 3d—(again in a fully automated manner, e.g. by means of an appropriate conveying machine) transported further to a further station D, here e.g. a pin punching station D (with a corresponding punching machine 5) (cf. Arrow H), and then (again in a fully automated manner) to a station E, here e.g. a pin galvanizing station E (with a corresponding galvanizing device 6) (cf. Arrow I), and subsequently to various further stations, in particular to various testing stations (not illustrated).

Figure 2:
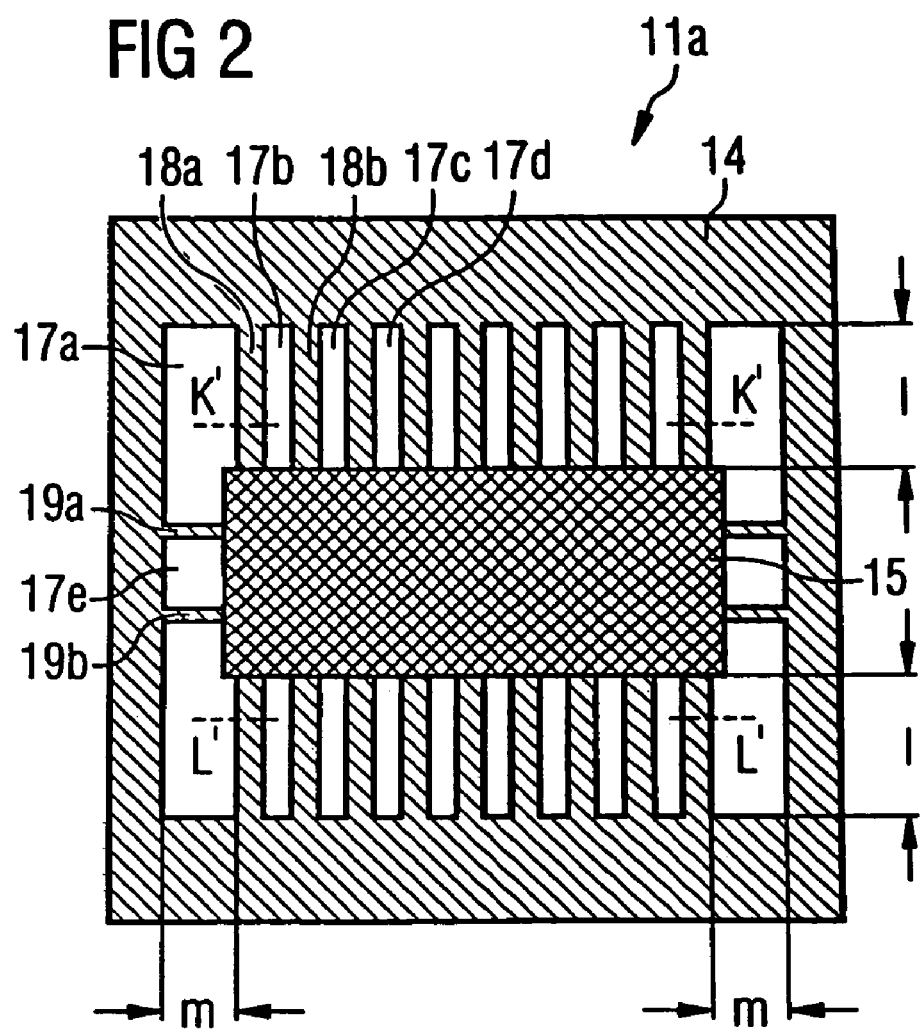
FIG. 2 shows a top view of one of the housings illustrated in FIG. 1—prior to the performance of corresponding punching and galvanizing process steps.

FIG. 2 is a top view of one of the housings 11a, 11b, 11c, 11d illustrated in FIG. 1, prior to carrying out corresponding punching and galvanizing process steps at the above-mentioned punching and galvanizing stations D, E.

To the housing basic body 15 manufactured e.g. of ceramics or plastics (here illustrated in narrow hatchings), the pin basic body 14 (lead frame or housing connection element 14, respectively) (here illustrated in wide hatching) is fastened, from which the corresponding housing pins 4a, 4b, 4c, 4d, 4e, 4f, 4g, 4h, 4i, 4k will later on be manufactured by the punching and galvanizing process steps that will be explained more exactly in the following.

Figure 3:
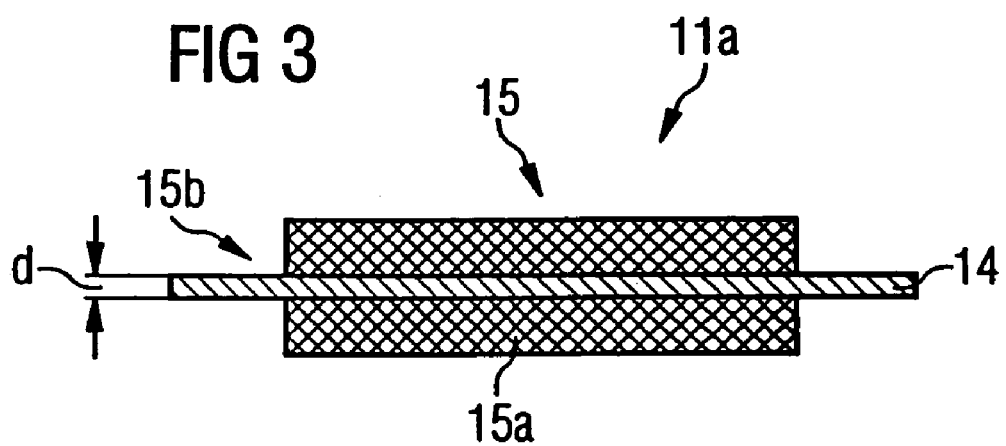
FIG. 3 a schematic side view of the housing illustrated in FIG. 2—prior to the performance of corresponding punching and galvanizing process steps.

The pin basic body 14 is designed in the form of a—substantially even—face and may—as results e.g. from FIG. 3—have a substantially equal (relatively small) thickness d of e.g. between 0.1 mm and 0.4 mm, e.g. a thickness d of 0.2 mm or 0.3 mm, over the entire face of the pin basic body 14.

The pin basic body 14 may—like conventional pin basic bodies—e.g. be manufactured of a corresponding electrically conductive metal or a corresponding electrically conductive metal alloy, respectively, in particular of a base metal or of a metal alloy consisting, for instance, completely or predominantly of base metals, e.g. of a copper-beryllium (CuBe) alloy.

As results from FIG. 2, the cross-section of the pin basic body 14 is substantially rectangular and extends, in accordance with FIG. 3, from the four side walls 15a, 15b of the housing basic body 15 outwards in a substantially perpendicular direction to the respective side wall 15a, 15b.

As illustrated in FIG. 2, the pin basic body 14 comprises recesses 17a, 17b, 17c, 17d, 17e (said recesses having been produced before, e.g. having been punched out from the pin basic body 14 prior to the mounting of the pin basic body 14 in the housing basic body 15, and passing through the pin basic body 14 in vertical direction.

The recesses 17a, 17b, 17c, 17d, 17e each have—in the areas lying outside the housing basic body 15—a substantially rectangular cross-section and each extend up to the areas close to the outer edges of the basic body 14.

At each side wall 15a, 15b, a plurality of the above-mentioned recesses 17a, 17b, 17c, 17d, 17e is provided side by side (here e.g. every eight—substantially equally large— recesses 17b, 17c, 17d at the left or right side wall 15a, respectively, and e.g. every three recesses 17a, 17e at the front or rear side wall 15b, respectively).

By the portion of a section 18a, 18b of the basic body 14 positioned closest to the housing basic body 15 between every two recesses 17b, 17c provided at the left or right side wall 15a, respectively, a corresponding pin 4a, 4b, 4c, 4d, 4e, 4f, 4g, 4h, 4i is formed after the performance of corresponding punching and galvanizing process steps (cf. below).

Correspondingly, by the portion of basic body sections 19a, 19b positioned closest to the housing basic body 15 between every two recesses 17a, 17e provided at the front or rear side wall 15b, respectively, a corresponding housing side web 24a, 24b is formed after the performance of corresponding punching and galvanizing process steps.

As results from FIG. 2, the recesses 17b, 17c provided at the left or right side wall 15a, respectively, have a length l—measured between the respective side wall 15a and the outer end of the above-mentioned sections 18a, 18b—of approximately 5 mm to 25 mm, in particular 8 mm to 20 mm (i.e. a length l larger than the length l' of the—later—pins 4a, 4b, 4c, 4d, 4e, 4f, 4g, 4h, 4i (cf. FIG. 4)).

As results further from FIG. 2, the recesses 17a, 17d provided at the front or rear side wall 15b, respectively, have a length m—measured between the respective side wall 15b and the outer end of the above-mentioned sections 19a, 19b—of approximately 2 mm to 20 mm, in particular 5 mm to 15 mm (i.e. a length m larger than the length m' of the—later—housing side webs 24a, 24b (cf. FIG. 4)).

As has already been mentioned above, and as will still be explained in detail in the following, in the present embodiment of the invention—other than with prior art—after the mounting of the semiconductor devices 3a, 3b, 3c, 3d in the corresponding housings 11a, 11b, 11c, 11d—i.e. even prior to the performance of corresponding galvanizing process steps—the pins 4a, 4b, 4c, 4d, 4e, 4f, 4g, 4h, 4i are punched out from the basic body 14 (cf. step II, FIG. 5), and only subsequently are the pins 4a, 4b, 4c, 4d, 4e, 4f, 4g, 4h, 4i (or the basic body 14, respectively) subject to corresponding galvanizing process steps (cf. step III, FIG. 5).

Figure 4:
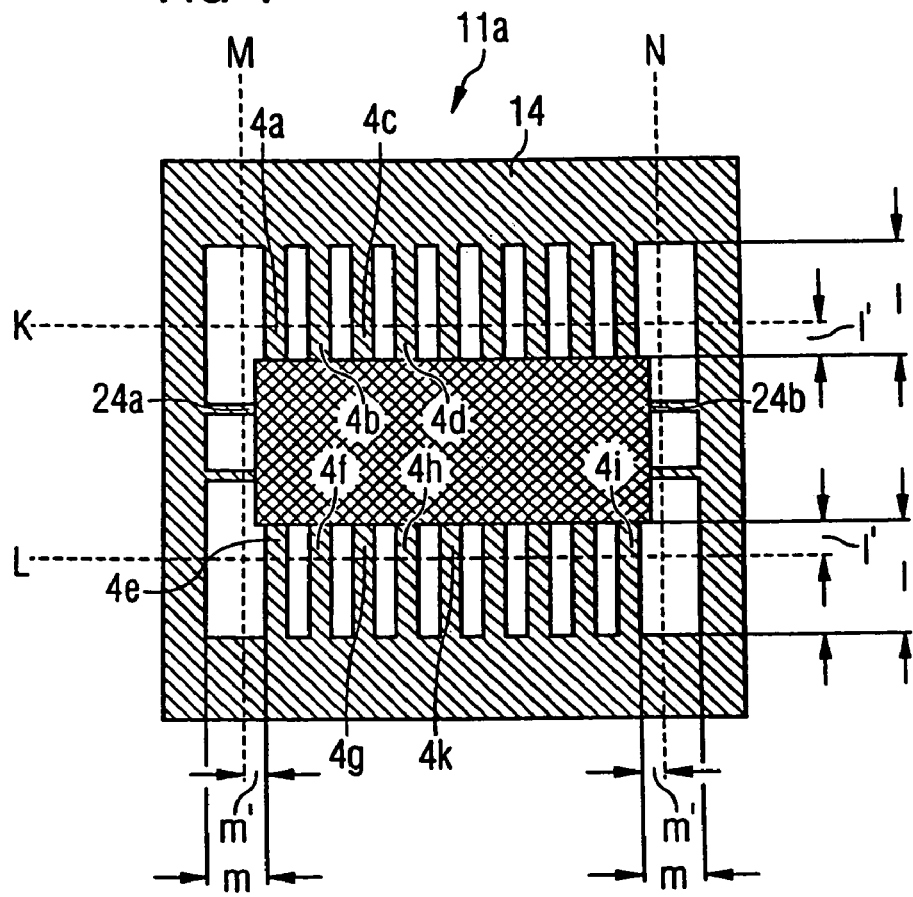
FIG. 4 shows a top view of the housing illustrated in FIGS. 1, 2, and 3, for illustration of the punching process steps carried out at the housing.

For manufacturing the pins 4a, 4b, 4c, 4d extending from the left side wall, the pin basic body 14 is—at station D illustrated in FIG. 1—punched through by the above-mentioned punching machine 5 along the punching line K illustrated in FIG. 4 and extending in parallel to the corresponding side wall (i.e. the pin basic body 14 is cut through at the punching line K in vertical direction from the top to the bottom).

Correspondingly, for manufacturing the pins 4e, 4f, 4g, 4h, 4i, 4k extending from the right side wall 15a opposite to the left side wall, the pin basic body 14 is—also at station D—punched through by the above-mentioned punching machine 5 along the punching line L extending in parallel to the right side wall 15a (i.e. the pin basic body 14 is cut through at the punching line L in vertical direction from the top to the bottom). The pins 4e, 4f, 4g, 4h, 4i, 4k manufactured such have (like the remaining pins 4a, 4b, 4c, 4d) a substantially rectangular cross-section.

The distance of the punching lines K or L, respectively, from the corresponding left or right side walls 15a, respectively, corresponds to the length l' of the pins 4a, 4b, 4c, 4d or 4e, 4f, 4g, 4h, 4i, 4k, respectively, produced by the punching (here: approx. 1 mm to 10 mm, in particular 2 mm to 5 mm).

For manufacturing the housing side webs 24a, 24b extending from the front or rear side wall 15b, respectively, the pin basic body 14 is (also at station D illustrated in FIG. 1) punched through by the punching machine 5 along the punching line M or N, respectively, illustrated in FIG. 4 and extending in parallel to the corresponding front or rear side wall 15b, respectively (i.e. the pin basic body 14 is cut through at the punching line M or N, respectively, in vertical direction from the top to the bottom).

The distance of the punching lines M or N, respectively, from the corresponding front or rear side walls 15b, respectively, corresponds to the length m' of the housing side webs 24a, 24b produced by the punching (here: the two side webs 24a at the front side wall, and the two side webs 24b at the rear side wall).

The length m' of the side webs may, for instance, be between approx. 0.2 mm and 5 mm, in particular between 0.5 mm and 2 mm.

FIG. 6 shows a schematic top view of the housing 11a illustrated in FIGS. 1, 2, 3, and 4, after the above-mentioned punching process steps have been carried out.

As results from FIG. 6, the pins 4a, 4b, 4c, 4d, 4e, 4f, 4g, 4h, 4i, 4k produced by the punching each have a breadth b of approx. 0.2 mm to 2 mm, in particular between 0.5 mm and 1 mm.

After carrying out the above-mentioned punching process steps, the corresponding housing is—as has already been explained above—transported further from the punching station D to the galvanizing station E.

Figure 8A:
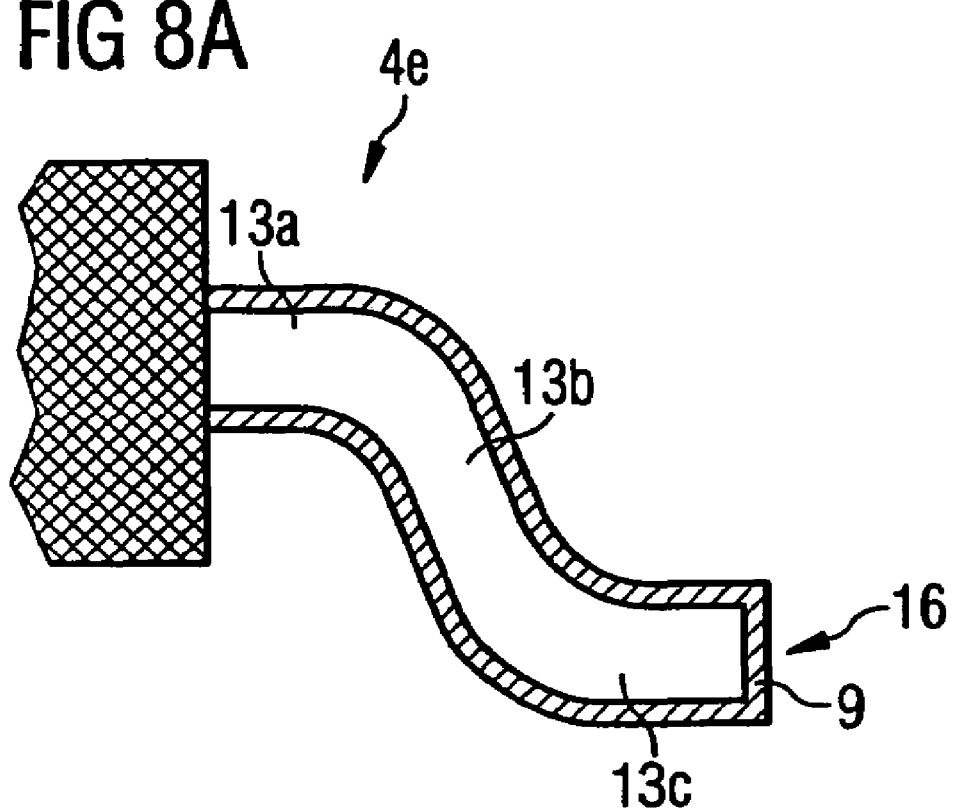
FIG. 8a shows a detail view of a pin after carrying out the punching and galvanizing process steps.

There, the pins 4a, 4b, 4c, 4d, 4e, 4f, 4g, 4h, 4i, 4k are—e.g. by immersing into corresponding baths provided at the galvanizing device 6—coated by means of corresponding electrodeposition processes, and as, for instance, illustrated in FIG. 8a, with a metal layer 9, in particular a precious metal layer (e.g. with a tin layer or a gold layer)—e.g. first of all the pins 4a, 4b, 4c, 4d extending from the left side wall, and then the pins 4e, 4f, 4g, 4h, 4i, 4k extending from the right side wall 15a.

The thickness of the metal layer 9 (e.g. of the tin or gold layer) may, for instance, be between 0.001 mm and 0.05 mm, in particular between 0.005 mm and 0.02 mm.

Prior to carrying out the above-mentioned deposition processes, the pins 4a, 4b, 4c, 4d, 4e, 4f, 4g, 4h, 4i, 4k may be cleaned or pretreated with corresponding special chemicals.

By the applying of the metal layer 9, the solderability of the pins 4a, 4b, 4c, 4d, 4e, 4f, 4g, 4h, 4i, 4k is improved; moreover, the pins 4a, 4b, 4c, 4d, 4e, 4f, 4g, 4h, 4i, 4k may be protected from corrosion thereby.

After (or before) the applying of the above-mentioned metal layer 9—e.g. in the course of the above-mentioned punching processes—the pins 4a, 4b, 4c, 4d, 4e, 4f, 4g, 4h, 4i, 4k may be bent to the corresponding shape (cf. FIG. 7a and FIG. 8a). A middle pin section 12b, 13b adjacent to a top pin section 12a, 13a that is extending in horizontal direction may, for instance, first of all be bent obliquely downwards, and then a bottom pin section 12c, 13c adjacent to the middle pin section 12b, 13b may be bent upwards (so that the bottom pin section 12c, 13c then extends—like the top pin section 12a, 13a—substantially in horizontal direction (in particular with respect to a circuit board 8 of a module to which the housing 11a—and thus the semiconductor device 3a—is to be connected later on)).

By the fact that, with the present embodiment—other than with prior art—the above-mentioned punching processes are carried out first of all, and only subsequently the above-mentioned galvanizing processes (and not vice versa), the front face 16 of the pins 4a, 4b, 4c, 4d, 4e, 4f, 4g, 4h, 4i, 4k (or the outer end face 16 at the end of the bottom pin sections 12c, 13c of the pins 4a, 4b, 4c, 4d, 4e, 4f, 4g, 4h, 4i, 4k, respectively) is—as is, for instance, illustrated in FIG. 8a and other than with prior art—coated with a metal layer 9.

Figure 8B:
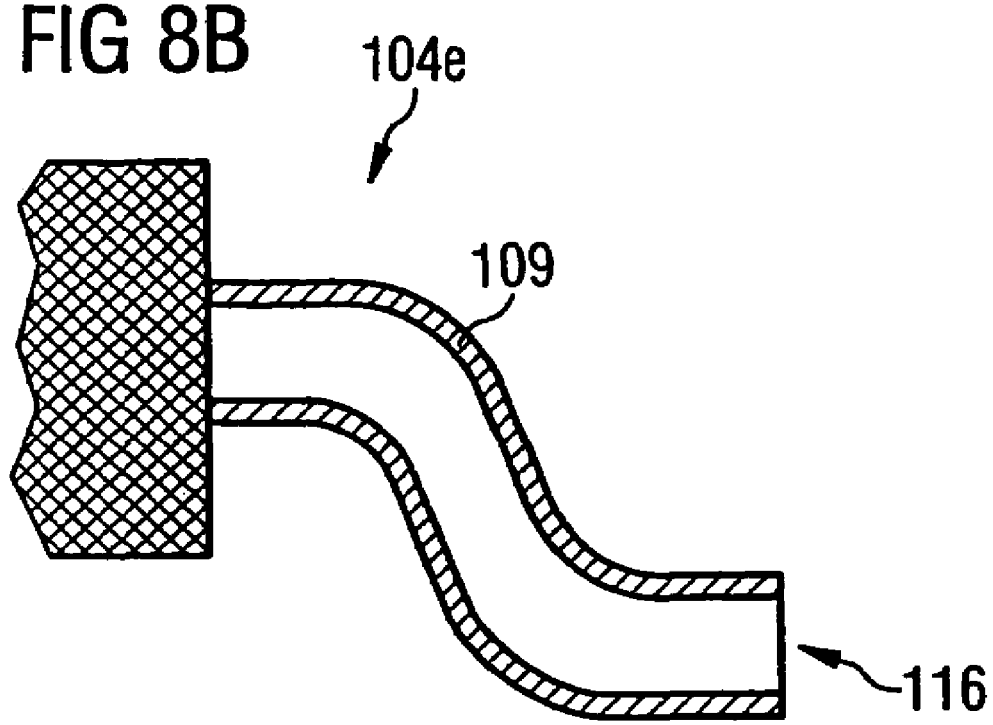
FIG. 8b shows a detail view of a conventional pin.

Contrary to this, as is illustrated in FIG. 8b, in the case of conventional pins 104e, the pin front face 106 has no metal coating 109 due to the fact that galvanizing is carried out first and punching is performed subsequently only.

When, in accordance with the embodiment of the invention—as is illustrated in FIG. 7a by means of the pin 4a—the housing 11a (and thus also the semiconductor device 3a incorporated therein) is connected to the circuit board 8 (i.e. the corresponding bottom pin sections 12c, 13c of the pins 4a, 4b, 4c, 4d, 4e, 4f, 4g, 4h, 4i, 4k are soldered with corresponding pads 20a, 20b at the circuit board 8), an electrical contact is provided between the corresponding circuit board pad 20a, 20b and the corresponding pin 4a, 4b, 4c, 4d, 4e, 4f, 4g, 4h, 4i, 4k.

Since—as explained above—the front face 16 of the pins 4a, 4b, 4c, 4d, 4e, 4f, 4g, 4h, 4i, 4k is also coated with the metal layer 9, the respective pin front face 16 is wetted by the solder during the soldering of the pins 4a, 4b, 4c, 4d, 4e, 4f, 4g, 4h, 4i, 4k due to the soldering connection 21 provided thereby (cf. FIG. 7a).

Contrary to this, in accordance with FIG. 7b, in the case of conventional pins 104a, 104e—since, as explained above, their front face 116 is not coated with a metal layer—the respective pin front face 116 is in general not wetted by the solder during the soldering of the pins 104a by the soldering connection 121 provided thereby.

For this reason, the soldering connections 21 provided with the embodiment of the invention are more stable than conventional soldering connections 121.

Figure 9:
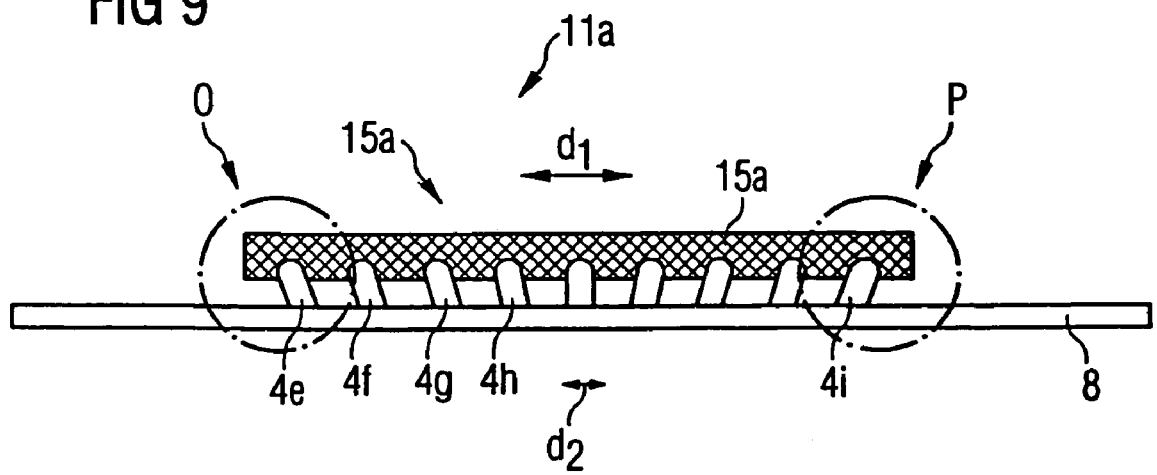
FIG. 9 shoes a side view of the housing illustrated in FIGS. 1, 2, 3, 4, 6, and 7a after carrying out the punching and galvanizing process steps, and after the connection to a circuit board.

The above-mentioned circuit board 8 and the semiconductor housing 11a connected thereto in the manner described above each have, in general, different thermal coefficients of expansion (cf. also the—relatively great—linear extension differences d1 caused by temperature of the housing 11a, and the—relatively small—linear extension differences d2 caused by temperature of the circuit board 8, illustrated in FIG. 9).

During heating or cooling down of a semiconductor device module, mechanical tensions between the circuit board 8 and the semiconductor device housing 11a will thus occur.

Since—as explained above—the soldering connections 21 provided in the embodiment of the invention are more stable than conventional soldering connections 121, it can be avoided that the soldering connections 21 may—e.g. caused by the above-mentioned mechanical tensions—break up or tear apart.

As is further illustrated in FIG. 9, the above-mentioned mechanical tensions are greatest in the areas 0, P of pins 4a, 4e, 4i that are positioned outermost at the housing 11a (here: at the pins 4a, 4e, 4i positioned outermost at the right or at the left, respectively, at the side walls 15a).

For this reason—in an alternative embodiment of the invention—only at the outermost pins 4a, 4e, 4i—here e.g. at the pins 4e, 4i positioned outermost at the right or at the left, respectively, at the side wall 15a, and at the pins 4a positioned outermost at the right or at the left, respectively, at the side wall opposite to the side wall 15a (and not—as with the embodiment explained before—at all pins 4a, 4b, 4c, 4d, 4e, 4f, 4g, 4h, 4i, 4k) the corresponding front faces 16 or end faces 16, respectively, may be coated with a metal layer 9 as described above (like, for instance, illustrated in FIG. 8a). The front faces of the remaining pins 4b, 4c, 4d, 4f, 4g, 4h, 4k are then free of a metal layer (as, for instance, illustrated in FIG. 8b).

This may, for instance, be achieved by that, in the course of punching process steps corresponding to the above-mentioned punching process steps (cf. also step II, FIG. 5), merely the above-mentioned pins 4a, 4e, 4i positioned outermost are punched out from the basic body 14 (not, however, the above-mentioned remaining pins 4b, 4c, 4d, 4f, 4g, 4h, 4k).

This may, for instance, be achieved by that—as illustrated in FIG. 2—the pin basic body 14 is—at station D illustrated in FIG. 1—punched through by the above-mentioned punching machine 5 along the punching lines K' or L', respectively, extending in parallel to the corresponding side walls (i.e. the pin basic body 14 is—merely in the area of the above-mentioned outside positioned pins 4a, 4e, 4i—cut through at the punching lines K' or L', respectively, in vertical direction from the top to the bottom).

Subsequently, galvanizing process steps corresponding to the above-mentioned galvanizing process steps are performed (cf. step III, FIG. 5). Only then are the remaining pins 4b, 4c, 4d, 4f, 4g, 4h, 4k punched out from the basic body 14 in the course of further punching process steps.

The above-mentioned proceeding is, in general, possible without problems since all of the above-mentioned outside positioned pins 4a, 4e, 4i—which have been punched out prior to the performance of the above-mentioned galvanizing process steps—are usually provided to carry a Vss or a Vdd signal (i.e. lie in normal operation on supply voltage potential Vss or ground potential Vdd) and are chip-internally connected with further pins 4b, 4c, 4d, 4f, 4g, 4h that have not yet been cut through or punched out, respectively, which—in normal operation—also carry these signals (i.e. the Vss or the Vdd signal).

When—e.g. by the applying of a corresponding potential to the (remaining) basic body 14 (after the punching out of the outside positioned pins 4a, 4e, 4i) e.g. a corresponding negative galvanizing potential (i.e. a galvanic voltage $V_{galvanic}$ smaller than 0 V) is applied, for carrying out the above-mentioned galvanizing process steps, to the pins 4b, 4c, 4d, 4f, 4g, 4h that have not yet been punched out, (or alternatively e.g. a corresponding positive galvanizing potential (i.e. a galvanic voltage $V_{galvanic}$ larger than 0 V)), the outside pins 4a, 4e, 4i that have already been punched out will (due to the above-mentioned connection to the further pins 4b, 4c, 4d, 4f, 4g, 4h that have not yet been punched out) also lie on a corresponding negative (or positive, respectively) galvanizing potential.

It is thus achieved that the outside positioned pins 4a, 4e, 4i are—during the performance of the above-mentioned galvanizing process steps—also lying on the correct potential for achieving a galvanic deposition (without correspondingly modified galvanizing process steps having to be performed as compared to the conventionally applied galvanizing process steps for safeguarding corresponding potentials).

In a further, alternative embodiment it is conceivable to punch out, prior to carrying out the corresponding galvanizing process steps—in addition to the outermost positioned pins 4a, 4e, 4i—further pins (e.g. the pins 4b, 4f positioned directly next to these pins 4a, 4e, 4i (or e.g. every two pins 4b, 4c, 4f, 4g positioned directly next to these pins 4a, 4e, 4i, or—as with the above-explained first embodiment—all pins, etc.)).

Figure 10:
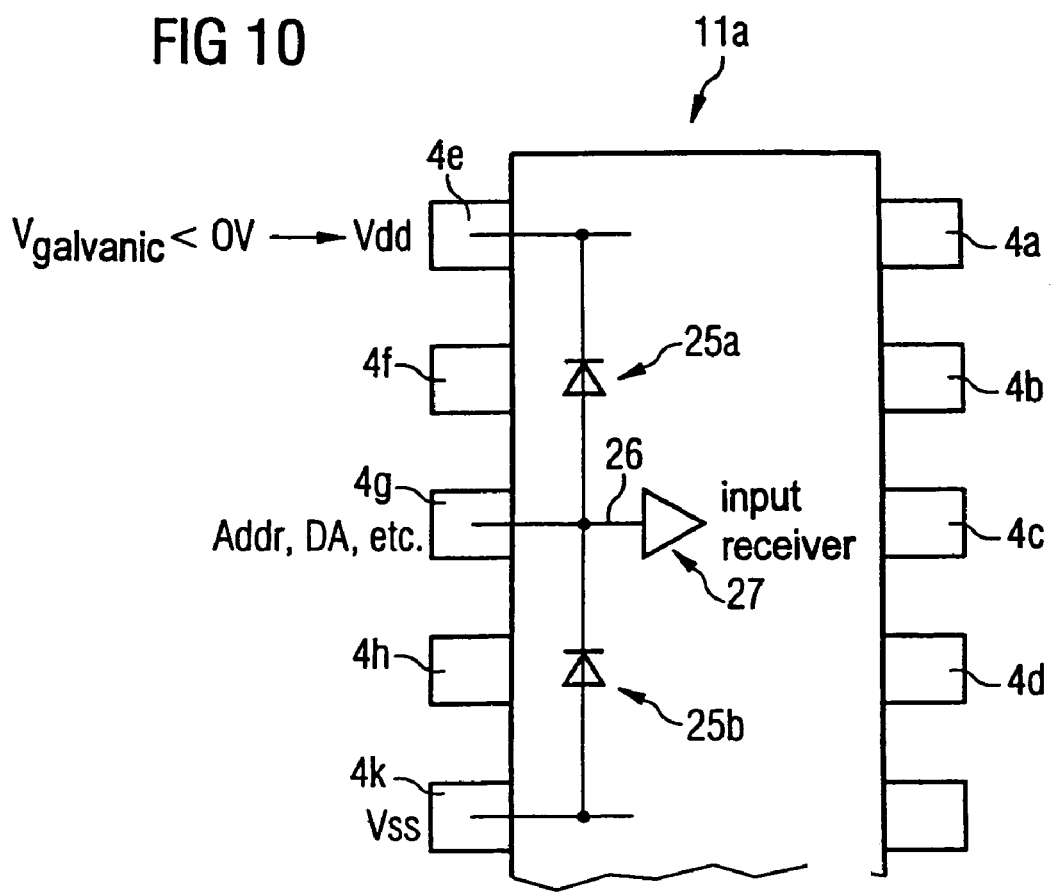
FIG. 10 shows a connection of the pins of the housing illustrated in FIGS. 1, 2, 3, 4, 6, 7a, and 9 for safeguarding correct pin potentials.

As is illustrated in FIG. 10, the electrical contacting of the pins 4a, 4b, 4c, 4e, etc. punched out prior to the above-mentioned galvanizing process steps may (during the above-mentioned galvanizing process steps) then i.a. be performed internally via the ESD protection diodes 25a, 25b provided on the semiconductor device 3a.

Every semiconductor device pin 4b, 4c, 4d, 4f, 4g, 4h provided for the inputting or outputting of (wanted) signals (e.g. of data signals DQ, address signals Addr, etc.) is—as is illustrated in FIG. 10 by the example of the (signal) pin 4g—connected via a corresponding first ESD protection diode 25a with a pin (here e.g. the pin 4e) which is provided for applying the ground potential Vdd, and via a corresponding second ESD protection diode 25b with a further pin (here e.g. the pin 4k) which is provided for applying the supply voltage potential Vss (and, for instance, via a line 26 with the—actual—signal driver device 27).

In order to provide the (then e.g. negative) potential necessary for the above-mentioned galvanizing process steps, in particular e.g. the cathodic deposition process steps, at the pins, it is thus sufficient to keep the ground potential pin 4e (or the Vdd signal, respectively) on a corresponding (negative) potential (i.e. to apply, for instance, a galvanic voltage $V_{galvanic}$ smaller than 0 V at the above-mentioned pin 4e)—then, the remaining pins connected with the pin 4e via the corresponding ESD protection diodes will lie on a (galvanic) potential of correspondingly sufficient level.

Alternatively, the (then positive) potential necessary for a corresponding anodic deposition process may then, for instance, be provided by e.g. keeping the supply voltage potential pin 4k (or the Vss signal, respectively) on a corresponding positive potential (i.e. to apply, for instance, a galvanic voltage $V_{galvanic}$ larger than 0 V at the above-mentioned pin 4k)—then, the remaining pins connected with the pin 4k via the corresponding ESD protection diodes will lie at a (galvanic) potential of correspondingly sufficient level.

When (additionally) the side webs 24a, 24b that are e.g. illustrated in FIG. 6 are connected with Vdd internally in the semiconductor device 3a, all pins (including the side webs 24a, 24b) may be cut through or punched out, respectively, prior to galvanizing.

What is claimed is:

1. A method for manufacturing pins, comprising:
    punching out at least one pin from a basic body by at least one punching process step;
    coating the pin or a section of the pin with a separate metal layer after completion of the punching out of the pin, wherein at least one metal deposition process step is used for coating the pin with the separate metal layer; and
    generating, for carrying out the deposition process step, a galvanizing potential at the pin by a corresponding voltage being applied at at least one of a further pin of the semiconductor device and side web of the semiconductor device electrically connected with the pin internally via the semiconductor device.

2. The method according to claim 1, wherein the front face at an outer end section of the pin is coated with the metal layer.

3. The method according to claim 1, further comprising mounting the basic body in a housing.

4. The method according to claim 3, wherein the mounting of the basic body in the housing takes place prior to completion of the punching out of the pin.

5. The method according to claim 1, wherein a plurality of pins positioned side by side are punched out from the basic body.

6. The method according to claim 5, wherein the pins positioned side by side are coated with a separate metal layer after completion of the punching out of the pins.

7. The method according to claim 5, wherein at least one of the plurality of pins positioned side by side is coated with a separate metal layer after completion of the punching out of the corresponding pin, and wherein the coating with a separate metal layer is performed with the remaining pins prior to completion of the punching out of the respective pins.

8. The method according to claim 7, wherein the at least one pin is, with respect to the remaining pins, positioned side by side, and positioned further outside or outermost.

9. The method according to claim 1, wherein the basic body is a lead frame.

10. The method according to claim 3, wherein the housing is a semiconductor device housing.

11. The method according to claim 1, wherein the further pin of the semiconductor device is electrically connected with the pin via a diode.

12. The method according to claim 2, wherein the diode is an ESD protection diode.

* * * * *